United States Patent [19]

Thompson

[11] 4,237,522
[45] Dec. 2, 1980

[54] CHIP PACKAGE WITH HIGH CAPACITANCE, STACKED VLSI/POWER SHEETS EXTENDING THROUGH SLOTS IN SUBSTRATE

[75] Inventor: David A. Thompson, South Salem, N.Y.

[73] Assignee: International Business Machines Corporation, Armonk, N.Y.

[21] Appl. No.: 53,660

[22] Filed: Jun. 29, 1979

[51] Int. Cl.³ .............................................. H05K 7/08
[52] U.S. Cl. ................................... 361/392; 174/68.5; 361/395; 361/416
[58] Field of Search ............... 361/416, 392, 413, 393, 361/395; 357/40; 174/68.5

[56] References Cited

U.S. PATENT DOCUMENTS

| | | | |
|---|---|---|---|
| 2,995,686 | 8/1961 | Selvin | 361/395 |
| 3,243,661 | 3/1966 | Ullery | 361/392 |
| 3,312,870 | 4/1967 | Rhoades | 174/68.5 X |
| 3,353,070 | 11/1967 | Paul | 361/416 X |
| 3,418,535 | 12/1968 | Martinell | 361/416 |
| 3,437,882 | 4/1969 | Cayzer | 361/414 X |
| 3,522,485 | 8/1970 | De Metrick | 174/68.5 X |
| 3,562,592 | 2/1971 | Cooke | 361/409 |
| 3,671,812 | 6/1972 | Pelsuo | 174/68.5 X |
| 3,949,274 | 4/1976 | Anacker | 361/392 X |
| 4,109,298 | 8/1978 | Hanni | 174/68.5 X |

*Primary Examiner*—Richard R. Kucia
*Attorney, Agent, or Firm*—Graham S. Jones, II

[57] ABSTRACT

A packaging module for VLSI chips of very high densities and very small size is constructed of a substrate through which a number of slots have been milled. Into each slot a stack of several capacitively coupled, insulated power sheets for connecting power to chips from bus lines and a shielded ribbon conductor are inserted. Preferably, the power sheets are oriented perpendicularly to the substrate. The upper edges of the power sheets are arranged flush with the top surface of the substrate so that the edges themselves form land areas upon which a chip connector can be fastened. Alternatively, an interconnection layer can be disposed between the top edges of the sheets as well as to the surface of the substrate and the chip connectors. The lower portions of the power sheets extend below the substrate to provide power connection tabs and decoupling capacitor connection tabs.

7 Claims, 8 Drawing Figures

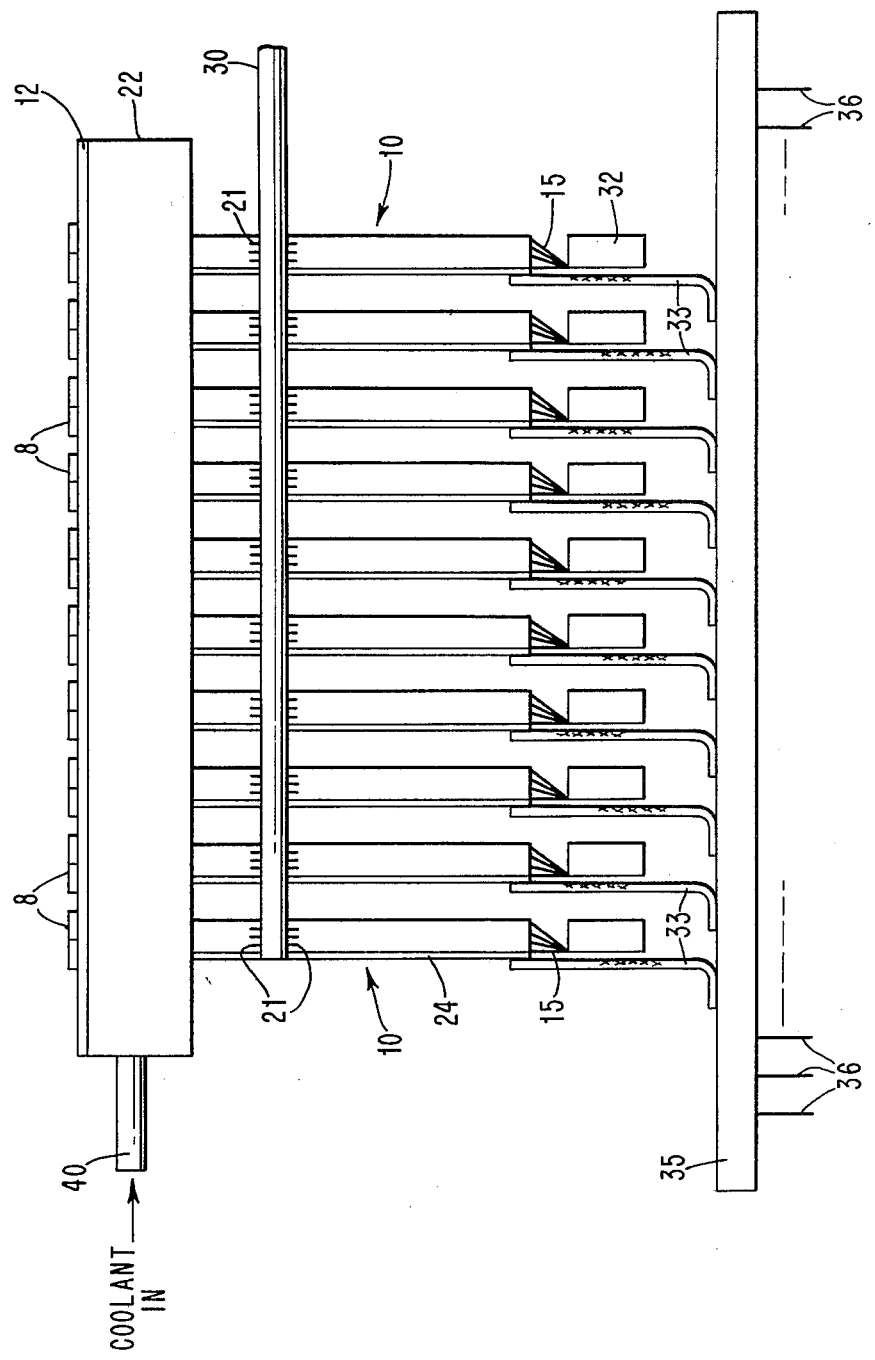

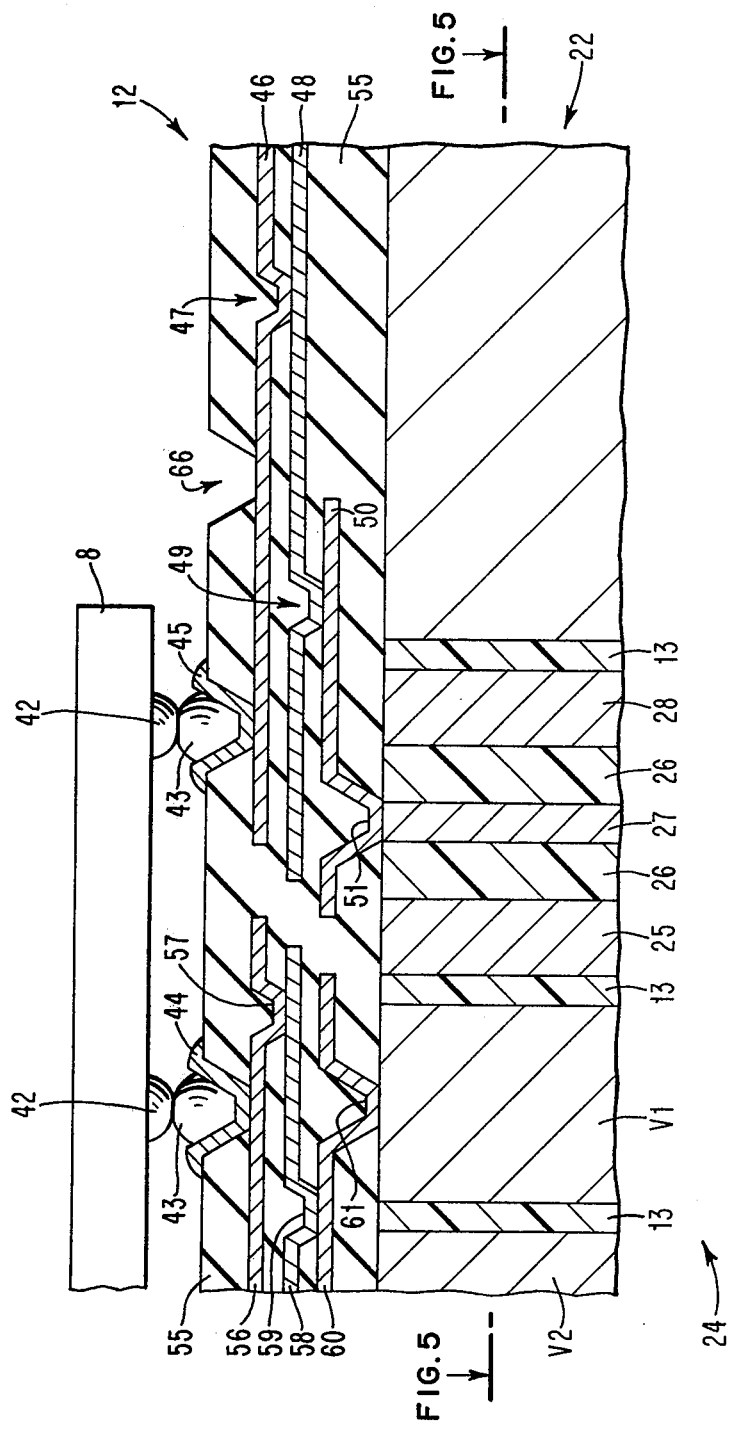

4,237,522

CHIP PACKAGE WITH HIGH CAPACITANCE, STACKED VLSI/POWER SHEETS EXTENDING THROUGH SLOTS IN SUBSTRATE

DESCRIPTION

Technical Field

This invention relates to high capacitance chip packaging structures and more particularly to such structures having parallel power supply conductors for supplying power to the electrical connections to VLSI chips.

BACKGROUND ART

A copending United States patent application Ser. No. 53,497 of Miersch and Romankiw, entitled "Thin Film Metal Package for LSI Chips" (YO978-065) describes a chip packaging carrier wherein several parallel power conducting carrier plates are stacked parallel to the surface upon which the chip terminals are connected electrically to pads. The planes are extensive in area and dielectric material is present in the spaces between the plates. Thus, high capacitance is afforded by such a structure. However, it is complicated to supply a large number of connections from the plates to the chips because numerous connections must be made through the parallel plates of metal up to the connection pads on the top surface of the packaging carrier.

U.S. Pat. No. 3,562,592 teaches placing chips at 45° relative to thin film conductor tracks, as distinguished from conductor carrier plates.

An object of this invention is to provide an efficient packaging structure for VLSI chips in high density applications wherein electrical noise from simultaneous switching of a large number of circuits must be suppressed as much as possible by providing high capacitance between power supply conductors to the chips as close as possible to the chips, and several power supply conductors must be connected to each chip.

Another object of this invention is to provide a simple, manufacturable and practical packaging structure which inhibits noise in high speed computers.

BRIEF DESCRIPTION OF THE DRAWINGS

FIG. 6 is a front elevation view of the structure shown in FIG. 1.

FIG. 7 is a sectional view taken along line 7—7 in FIGS. 4 and 5 of the upper layer of interconnection metallurgy and the upper ends of the power sheets shown in greater detail and in a preferred embodiment in which the upper surfaces of the power sheets interface indirectly with the chips through this upper layer.

DISCLOSURE OF INVENTION

Figure 1:
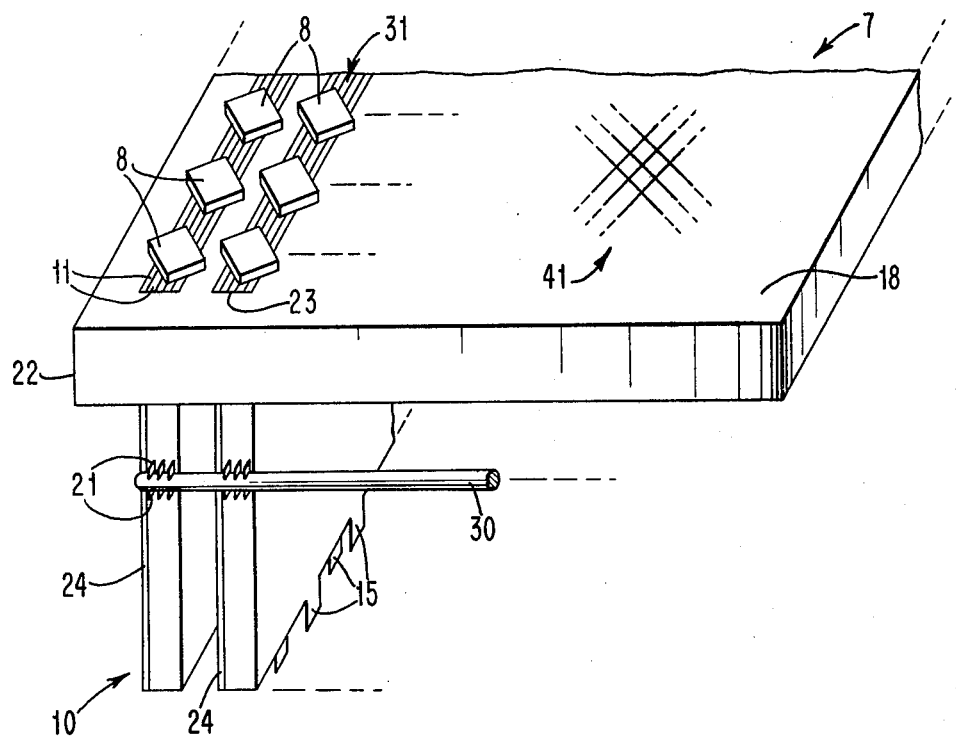
FIG. 1 shows a perspective view of a module comprising a packaging structure for a large array of VLSI chips.
Figure 2A:
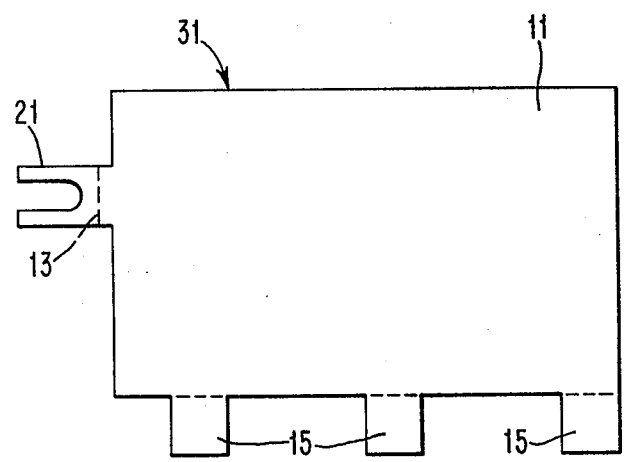
FIG. 2A is a right elevation of a single power sheet of the variety of power sheets shown in FIG. 1.
Figure 2B:
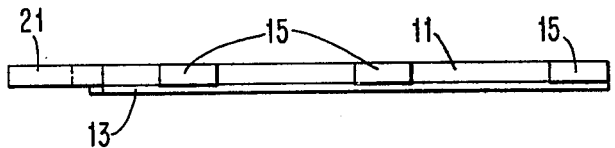
FIG. 2B is a bottom view of the substrate which serves as a power sheet shown in FIG. 2A.
Figure 5:
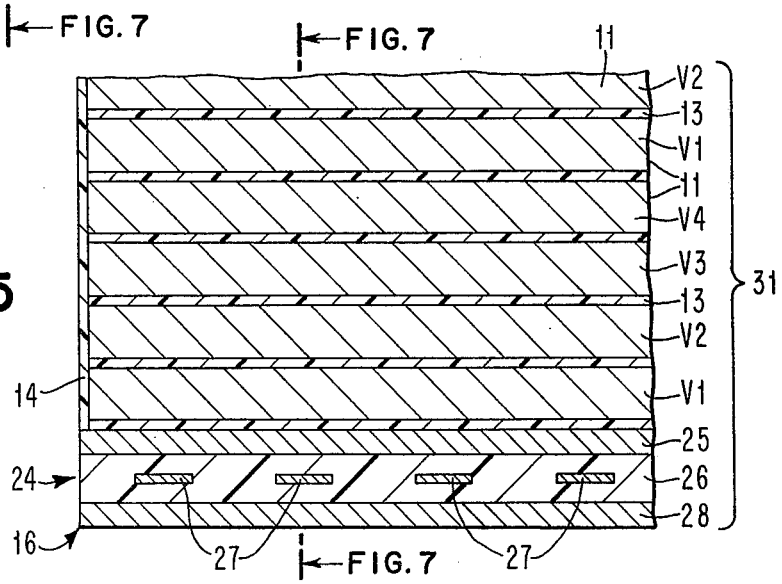
FIG. 5 is a fragmentary sectional top view of the power sheet, dielectric and ribbon conductors shown in FIGS. 1 and 4 taken along line 5—5 in FIG. 7.

In packaging of high speed, VLSI chips 8 on a carrier module 7 in FIG. 1, it is imperative for the package to possess a very low value of inductance in its power supply paths to satisy maximum switching current requirements of chips 8. With the chip carrier module 7 of the variety shown in FIG. 1, a substrate 22 is the mechanical support base upon which the structure of module 7 is constructed. Additionally, substrate 22 can serve the important electrical function of providing a ground plane. Substrate 22 is shown in a perspective view in FIG. 3 and it can be seen that ten slots 23 have been milled through substrate 22. Into each slot 23 is inserted a stack 10 of power sheets 11 laminated together with dielectric insulation layers 13 and a shielded ribbon conductor cable 24 (as shown in FIG. 5). In each stack 10 are included twelve power sheets 11 stacked upon each other plus one shielded ribbon conductor cable layer 24, with the stack extending through the slot 23. Each power sheet 11 shown in FIGS. 2A and B includes a connection tab 21 for connection to DC bus bar rods 30, only one of which is shown for convenience of illustration, and connection tabs 15 for decoupling capacitors 32 (shown in FIG. 6). Power sheets 11 are connected to various bus bar rods 30 by means of staggered connection tabs 21 (most of which are not shown for convenience of illustration). The stacks 10 are sealed into the substrate 22 in rigid mechanical contact therewith, but electrically isolated from direct current flow. The large parallel surfaces of sheets 11 provide very large values of capacitance concomitantly with minimal values of inductive coupling therebetween. Stacks 10 are individually connected to various bus bar rods 30 as required by the chips 8.

Upon the planar upper metal surface 18 on the top of substrate 22 which is machined flat, preferably thin film interconnecting lines 41 are deposited in multiple layers as shown in greater detail with reference to FIG. 7.

Figure 3:
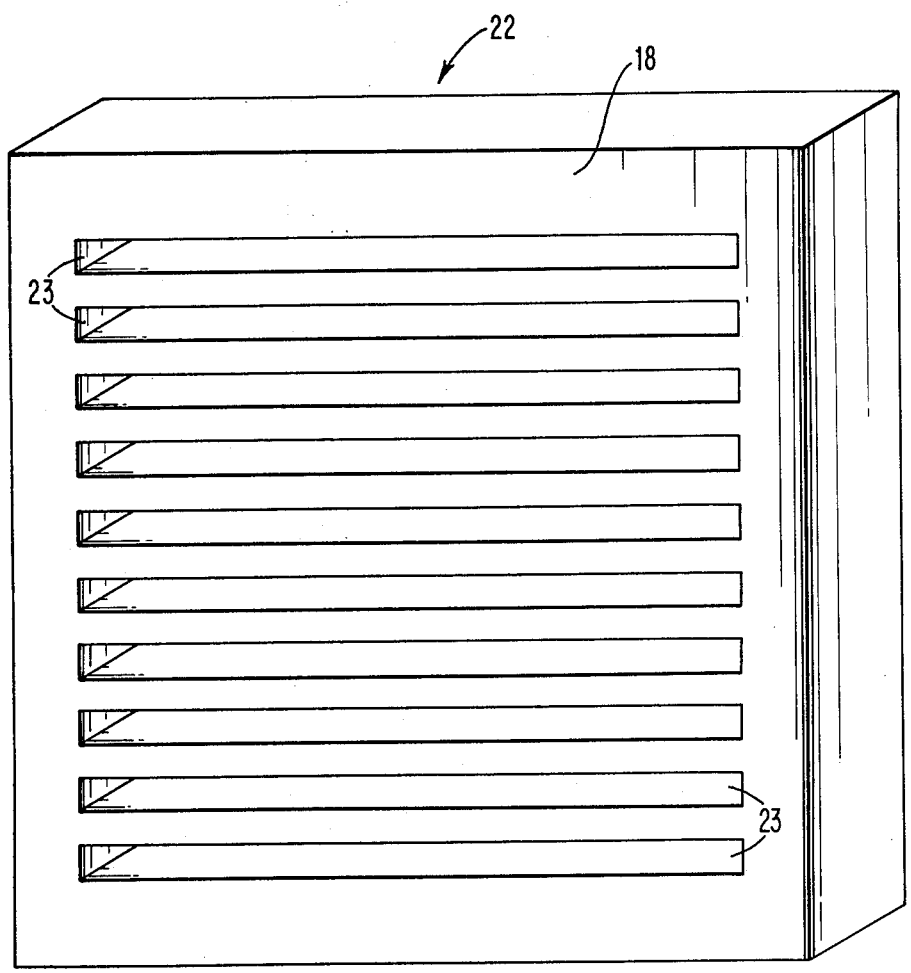
FIG. 3 is a top perspective view of the substrate of the packaging structure shown in FIG. 1.

Substrate 22 in FIG. 3 is manufactured from a sheet of metal about 90 mm square and 12 mm thick into which ten slots 23 are prepared by milling. Each slot 23 includes two surfaces which are accurately located to within one mil from a reference position. The slots 23 are about 150 mils wide on 300 mil centers.

Figure 4:
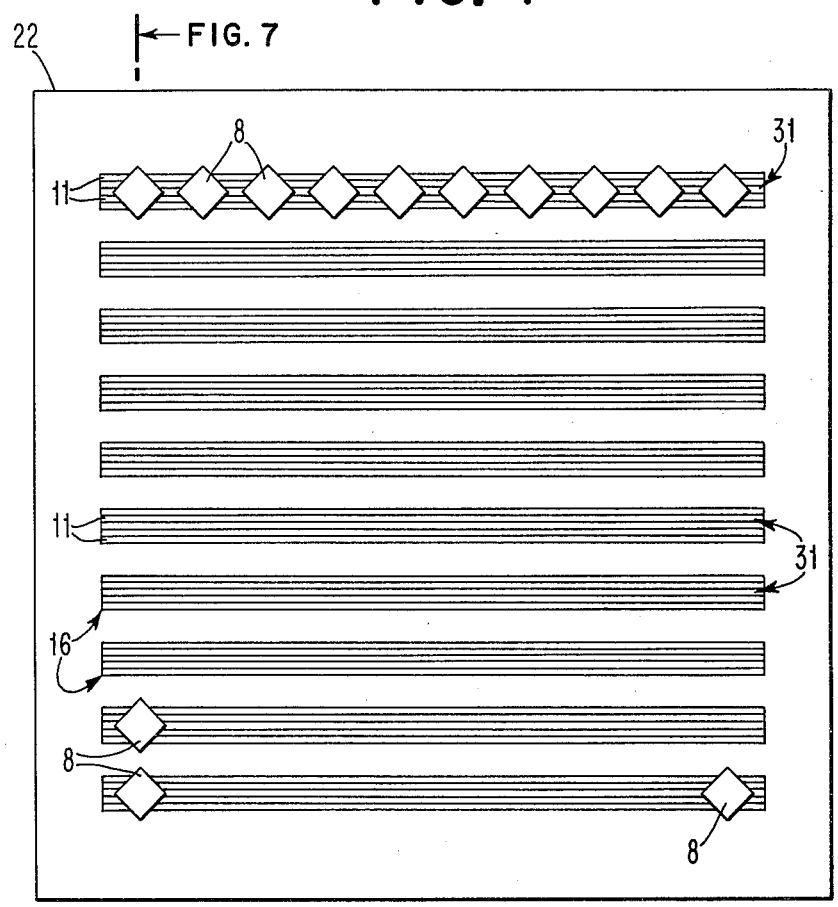
FIG. 4 is a top view of the substrate, chips and power sheet sandwich structure shown in FIG. 1.

Chips 8 are arranged in a 10 by 10 array on top of substrate 22, with the placement of two columns of chips shown for convenience of illustration and the number of rows reduced but with the representation in FIG. 4 being far more representative of a literal preferred embodiment. As shown in FIG. 5, the ribbon conductor cable 24 is bonded into the corner 16 formed by the two accurately milled surfaces, thus locating signal conductors with one mil accuracy. The power sheets 11 are about 10 mils thick with insulation 13 about ½ mil thick. The solder ball (C-4) chip interconnection pads (42 in FIG. 7) will be on 7.5 mil centers on a chip 8, for example, but if the chip is turned at a 45° angle, about half of the C-4 pads are centered exactly over power sheets 11 so that direct bonding of C-4 solder ball pads to the upper surfaces 31 of the sheets 11 can be used if desired. Ribbon conductor cable 24 connects to the thin film metallurgy shown in FIG. 7 with several mils alignment tolerance.

FIG. 5 shows an expanded view of one corner of one slot 23, containing the two accurately machined faces of that slot, against which a stack 10 is registered and bonded. This positions the signal conductor 27 accurately enough for connection to the interconnection layers 12. The ribbon cable 24 contains signal conductors 27 between shielding members 25 and 28, with insulation 26. Some or all of the power sheets must be insulated from the substrate 22 by layer 14 as well as from each other by layers 13. Such ribbon cable 24 and the methods for terminating them to other cables and connectors are well known.

Stacks 10 may be glassed, or bonded into the substrate 22. Referring to FIG. 6, the ribbon cable 33 is connected to ribbon conductor cable 24 at one end and to a signal distribution board 35 (with connection pins 36 on its lower surface). Ribbon cables 33 may be rigid or flexible. The metals may be copper or an expansion-coefficient matched material as discussed below.

Referring to FIGS. 2A and B again, power sheets 11 have the connection tabs 21 for connection to DC bus bar rod 30 and may have the additional connection tabs 15 for attachment of decoupling capacitors on the lower surface of the sheets. Preferably there is a set of four sheets 11 which alternates as $V_1$ through $V_4$ in FIG. 5 so that each of the types of sheets 11 would have its tabs 15 and 21 in a unique position. The ribbon conductor cable 24 would be terminated at the back in a solder joint to a flexible ribbon cable of conventional type, or if sufficiently flexible, could bend 90° and be bonded to a printed circuit board as in FIG. 6.

With this design there are about 20 square cm of surface per chip per bus 30. This allows use of 10—25 micron insulation ($\frac{1}{2}$—1 mil), which is easy to fabricate, while providing a sufficiently high interplane capacitance to suppress the undesired high frequency electrical transients at the power connection points to the chips 8. In addition, the power sheets 11 have prefinished surfaces so a pinhole in the insulation 13 does not necessarily cause a short circuit as it would if the structure were built up by depositing conductive layers and insulating layers in alternation upon one another, for example by vacuum evaporation. The decoupling capacitors 32 shown are in addition to the 1 $\mu$F or so of capacitance built into the power sheets 11 and dielectric 13, and they are primarily for low frequency transients. They also provide some damping at higher frequencies. In order to obtain 160 to 200 signal leads per ribbon cable 33, conductors are located on 20 mil centers, which allow easy connection by means such as reflow soldering.

The chip carrier module 7 should be thermally matched to the chips 8. Hence, use of molybdenum has been considered in substrate 22. However, this assumes that the carrier reaches the same temperature as the silicon, which is true only for low thermal conductors. In FIG. 6 a coolant pipe 40 is shown in substrate 22. Coolant passages would be machined through substrate 22. The temperature rise can be controlled to permit the use of high expansion metals, such as copper or brass in substrate 22, which are easier to work with. Alternately, the metal block can be maintained cold for near-zero expansion. Every connection to the chip 8 can be routed through the thin film conductors 41, etc. If each of such leads is routed with at least one 90° bend, then the thermal expansion of the silicon (about 1 micron) can be easily absorbed by flexure of the copper line and organic insulation. There will be no stress on the C-4 joints and no fatigue problems.

FIG. 7 shows a design of an actual transmission line structure for use within an internal interconnection metallurgy layer 12 shown in FIG. 6 which would be deposited upon planar metal surface 18. Chip 8 rests upon layer 12 externally interconnected and supported by means of C-4 solder balls 42 connected to the solder balls 43 on vias 44 and 45. Vias 44 and 45 are formed in conical depressions in the top surface of layer 12. Via 45 connects by V-shaped conductors down to an upper lossy transmission line 46. Transmission line 46 extends through a via 47, beyond the right edge of the drawing to one or more other chip connected vias similar to via 44. A transmission line 48 below line 46 is also connected to via 47. Lossy line 48 has been shown to be immediately beneath line 46 for convenience of illustration, but preferably line 48 would extend into the plane of the page, while below it, lossy line 50 connected by via 49 up to line 48 would preferably but not necessarily extend parallel to line 46, as shown. This arrangement would be suitable to an x, y rectilinear coordinate mapping system with lines in the x direction on the level of lines 48, lines in the y direction of the level of line 50, and the top level (including line 46) providing a testing and engineering change layer through opening 66 (only one of which is shown for convenience of illustration), where a laser can cut the connection, etc., in conventional fashion. Transmission lines 56, 58 and 60 and vias 57, 59, and 61 provide connections of C-4 solder balls 43 to power sheet $V_1(11)$.

In FIG. 7, the individual layers contained in the interconnection layer 12 are shown for clarity with great vertical exaggeration. In practice, it may be possible to fabricate via 44 directly in contact with conductor sheet $V_1(11)$. Also, the solder balls 42 and 43 are shown as they begin to fuse. After reflow soldering, they would appear as a single, larger ball.

The lines 46, 48 and 50, as well as 56, 58 and 60, are encapsulated within dielectric 55 composed preferably of polyimide, plastic, or glass which insulates and supports them. The lowest line 50 is electrically connected by via 51 to conductor 27 of ribbon conductor 29 (see FIG. 5). The lines 46, 48, and 50 combined with ground plane 22, etc., comprise individual lossy strip transmission lines which are designed to propagate high speed signal pulses while damping out reflection on the other hand.

Power sheet $V_1$, coupled through the upper surface of substrate 22, supplies power with a minimum amount of package inductance to lines 56, 58, and 60, etc., and provides input and output signal paths for this package.

With this design, it is possible to achieve higher wiring density 46, 48, 50 since the lines 56, 58, and 60 can be very narrow and the thin film nature of the lines permits the power supply to be delivered through the substrate 22 and lines to the chip 8 with a minimum amount of added inductance.

It should be noted that the lines 46, 48, and 50, etc., and the ground plane provided by substrate 22 as shown in FIG. 7 form thin film strip transmission lines. This is a batch fabricated pattern which is made by the well known thin film deposition techniques of photoresist photolithographic masking used in making VLSI chips, vacuum deposition by such techniques as evaporation and sputtering, electroplating and the like, which greatly facilitates the manufacture of a module 7.

The metallization and vias are built up in successive layers to form the structure in FIG. 7 one level at a time in the batch fabricated mode. Thus, the metallization line 50 in the x direction is deposited upon a layer of dielectric 55 through which a via hole has been opened by a batch processing step. Next, the metallization 50 is covered with more dielectric 55 and then metallization 48 is deposited extending in the y direction, and so forth.

Although the embodiments shown in the figures show only homogeneous metal package substrates 22 and ribbon cables 24, it is obvious that a metal coated insulator can be used as a substrate 22 and that the layout flexibility of the interconnection layer 12 allows use of more conventional pin connections to carry signals out of the assembly 7.

INDUSTRIAL APPLICABILITY

This invention is adapted to use in the packaging of large scale, extremely compact and extremely fast computer systems employing very large scale integration of circuits on each of the chips.

While this specification illustrates and describes the preferred embodiments of the subject invention, it is to be understood that the invention is not limited to the precise implementation and construction details described herein. The right is reserved to all changes and modifications encompassed by the scope of the underlying invention as defined in the claims which follow.

Having thus described our invention, what we claim as new and desire to secure by Letters Patent is:

1. In a packaging module for circuit chips including a planar substrate having opposed surfaces, a plurality of stacked power distribution conductive layers, a plurality of land areas on a level adjacent to that of one surface of said substrate for mounting the interconnection to said chips, said stacked power distribution layers being composed of a plurality of parallel, flat conductive metallic sheets having large parallel surfaces with dielectric material between said sheets and with high electrical capacitance between said metal sheets and minimal inductive coupling therebetween, the improvement comprising at least one slot through said substrate between said opposed surfaces, with said slot containing a stack of said metal sheets extending therethrough with their flat surfaces extending through said slot and with at least some of said sheets insulated electrically from said substrate.

2. A module in accordance with claim 1 wherein said stack of sheets extends substantially beyond said substrate on the surface of said substrate opposite to the location of said chips.

3. A module in accordance with claim 2 wherein connection tabs are provided for individual ones of said sheets for connection to sources of power.

4. A module in accordance with claim 2 wherein connection tabs are provided for individual ones of said sheets for connection to decoupling capacitors.

5. A module in accordance with claim 1 wherein said substrate is composed of metal with a plurality of slots machined in parallel through said substrate, containing a plurality of said dielectric layers and sheets laminated together with ribbon conductor layers for connection of low power AC signals through said substrate in each of said slots.

6. A module in accordance with claims 1, 2, 3, 4 or 5 in which said sheets have surfaces juxtaposed with said level adjacent to said one surface for electrically coupling to said interconnections to said chips to supply electrical power to said chips through said sheets.

7. A module in accordance with claims 1, 2, 3, 4 or 5 in which said sheets have surfaces electrically connected through interconnection metallurgy to said chips.

* * * * *